(12) United States Patent
Song et al.

(10) Patent No.: US 6,509,083 B2
(45) Date of Patent: Jan. 21, 2003

(54) HIGH COERCIVITY MAGNETIC RECORDING MEDIUM COMPRISING A SPUTTER TEXTURED LAYER

(75) Inventors: Xing Song, Fremont, CA (US); Ga-Lane Chen, Fremont, CA (US); Charles Leu, Fremont, CA (US); Qixu Chen, Milpitas, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 63 days.

(21) Appl. No.: 09/768,357

(22) Filed: Jan. 25, 2001

(65) Prior Publication Data

US 2001/0041272 A1 Nov. 15, 2001

Related U.S. Application Data

(63) Continuation of application No. 09/043,610, filed as application No. PCT/US97/16512 on Sep. 17, 1997, now Pat. No. 6,218,028.
(60) Provisional application No. 60/035,502, filed on Jan. 15, 1997.

(51) Int. Cl.$^7$ ................................................ G11B 5/66
(52) U.S. Cl. ...................... 428/141; 428/336; 428/408; 428/457; 428/694 TS; 428/694 SG; 428/900
(58) Field of Search .................... 428/336, 141, 428/694 TS, 900, 457, 408, 694 SG (56) References Cited

U.S. PATENT DOCUMENTS

| | | |
|---|---|---|
| 4,900,397 A | 2/1990 | Werner et al. |
| 5,062,021 A | 10/1991 | Ranjan et al. |
| 5,166,006 A | 11/1992 | Lal et al. |
| 5,202,810 A | 4/1993 | Nakamura et al. |
| 5,273,834 A | 12/1993 | Hoover et al. |
| 5,302,434 A | 4/1994 | Doerner et al. |
| 5,344,706 A * | 9/1994 | Lambeth et al. ............. 428/336 |
| 5,356,522 A * | 10/1994 | Lal et al. ............... 204/192.15 |
| 5,506,017 A * | 4/1996 | Ranjan et al. ............. 428/65.7 |
| 5,693,426 A * | 12/1997 | Lee et al. .................... 428/611 |

OTHER PUBLICATIONS

"Investigation of CoNiCr Thin Films Deposited [100] and [110] Cr Single Crystals," by Wong et al., IEEE Transactions on Magnetics, vol. 27, No. 6 (Nov. 1991), pp. 4733–4735.

"Magnetic Properties of CoPtCr Thin Films with (1120) Crystal Orientation," by Mirzamaani et al., J. Appl. Phys., vol. 69, No. 8 (Apr. 15, 1991), pp. 5169–5171.

"Bicrystal Advanced Thin–Film Media for High Density Recording," by Min et al., J. Appl. Phys. vol. 75, No. 10 (May 15, 1994).

"Microstructure and Recording Properties of Bicrystal Disks with GaAs Substrates," by Ding et al., IEEE Transactions of Magnetics, vol. 30, No. 6 (Nov. 1994) pp. 3978–3980.

"Magnetic and Recording Characteristics of Bicrystalline Longitudinal Recording Medium Formed on an MgO Single Crystal Disk Substrate," by Futamoto et al., IEEE Transactions on Magnetics, vol. 30, No. 6 (Nov. 1994), pp. 3975–3977.

(List continued on next page.)

*Primary Examiner*—Stevan A. Resan
(74) *Attorney, Agent, or Firm*—McDermott, Will & Emery (57) ABSTRACT

Reproducible texturing of magnetic recording media is enhanced by sputtering a buffer layer, such as Ni-P, on a nonmagnetic substrate, prior to sputtering a textured bump layer. A magnetic recording medium comprising a sputter textured metal layer and high coercivity is achieved by employing an underlayer, such as NiAl or FeAl, preferably a composite underlayer containing a chromium or chromium-alloy layer and a NiAl layer, on the sputter textured layer. Advantageously, the buffer layer, underlayer, textured bump layer, magnetic layer and carbon overcoat can be sputter deposited in a single apparatus.

2 Claims, 11 Drawing Sheets

OTHER PUBLICATIONS

"Modeling of Thin–Film Media with Advanced Microstructure for Untrahigh Density Recording," by Ye et al, J. Appl. Phys., vol. 75 (May 15, 1994), pp. 6135–6137.

"Effect of Microstructural Features on Media Noise in Longitudinal Recording Media," by Nolan et al., J. Appl. Phys., vol. 73, No. 10 (May 15, 1993), pp. 5566–5568.

"Micromagnetic and Experimental Studies of CoPtCr Bicrystal Thin Film Media," by Peng et al., 1995 IEEE, JA–01. No month.

"Bicrystal Cluster Structure and Magnetic Properties of CoCrTa/Cr Thin Film Media," by Yahisa et al., 1995 IEEE JA–02. No month.

"Fabrication and Recording Performances of Bicrystal Disks on GaAs Substrates," by Ding et al., Journal of the Magnetics Society of Japan, vol. 18, Supplement, No. S1 (1994). No month.

"Experimental Study on Recording and Track Edge Characteristics of Bicrystal Thin Film Media," by Ding et al., Manuscript. No date.

"NiAl Underlayers fo R CoCrTa Magnetic Thin Films," by Lee et al., IEEE Transactions on Magnetics, vol. 30, No. 6 (Nov. 1994), pp. 3951–3953.

"Effects of Cr Intermediate Layers on CoCrPt Thin Film Media on NiAl Underlayers," by Lee et al., IEEE Transactions on Magnetics, vol. 31, No. 6 (Nov. 1995), pp. 2728–2730.

"Seed Layer Induced (002) Crystallographic Texture in NiAl Underlayers," by Lee et al., J. Appl. Phys., vol. 79, No. 8 (Apr. 15, 1996), pp. 4902–4904.

"The Control and Characterization of the Crystallographic Texture of Longitudinal Thin Film Recording Media," by Laughlin et al., IEEE Transactions on Magnetics, vol. 32, No. 5 (Sep. 1996), pp. 3632–3637.

"FeAl Underlayers for CoCrPt Thin Film Longitudinal Media," by Lee et al., CC–01, 41st Annual Conference on Magnetism and Magnetic Materials, Atlanta, Georgia (Nov. 12–15, 1996).

"Thin Film Media With and Without Bicrystal Cluster Structure on Glass Ceramic Substrates," by Chen et al., Manuscript. No date.

"Epitaxy and Crystallographic Texture of Thin Films for Magnetic Recording," by Laughlin et al., Mat. Res. Soc. Symp. Proc., vol. 343, pp. 327–337. No date.

"The Micromagnetic Properties of High–Coercivity Metallic Thin Films and Their Effects on the Limit of Packing Density in Digital Recording," by Chen, IEEE Transactions on Magnetics, vol. MAG–17, No. 2 (Mar. 1981), pp. 1181–1191.

"The Effect of Cluster Size on Thin Film Media Noise," by Miles et al., IEEE Transactions on Magnetics, vol. 31, No. 2 (Mar. 1995).

"Electron Spectroscopic Imaging Analysis of Compositional Inhomogeneity in CoCrTa Longitudinal Thin Film Media," by Yahisa et al., IEEE Transactions on Magnetics, vol. 31, No. 6 (Nov. 1995).

"Evolution of Bicrystal Media Development," by Chang et al., Manuscript. No date.

* cited by examiner

Digital Measurement Systems - Vibrating Sample Magnetometer

| | | | |
|---|---|---|---|
| Filename: | 10289672 | Sample ID: | 1028967 |
| Date: | 20 Nov 1996 | | |
| Test start time: | 21:14:41 | Test duration : | 00:10:53 |
| Temperature: | 810.0° C | Rotation angle: | 0.0 deg |
| Volume in cc: | 4.212E-09 | Mass in grams : | 8.310E-02 |
| Hmax | 1.200E+04 | Oersted | |
| Is | 9.847E-04 | EMU | |
| Ir | 9.173E-04 | EMU | |
| SQ | 9.315E-01 | Ir/Is | |
| S* hys | 8.957E-01 | t - ( Ir/He) (:t/Slope at Hc) | |
| Hc | 3.323E+03 | Oersted | |
| dh in Oersted | 4.325E+02 | between + .5 * Ir and -.5 * Ir | |
| SED | 1.302E-01 | dH/Hc | |
| SIGMA | 1.185E-02 | Is/gram | |
| Slope at .75*Hc | 2.178E-01 | (EMU [at H=01 - EMU[ at H=Hc/1.331)/Ir | |

FIG. 10

FIG. 11

HIGH COERCIVITY MAGNETIC RECORDING MEDIUM COMPRISING A SPUTTER TEXTURED LAYER

RELATED APPLICATION

This application is a Continuation of application Ser. No. 09/043,610 filed Mar. 19, 1998, now U.S. Pat. No. 6,218,028 which is a 371 of International Patent Application No. PCT/US97/16512 filed Sep. 17, 1997.

This application claims priority from provisional patent application Serial No. 60/035,502 filed Jan. 15, 1997, entitled "FABRICATION OF HIGH COERCIVITY MEDIA ON SPUTTER TEXTURED SUBSTRATES," the entire disclosure of which is hereby incorporated herein by reference.

TECHNICAL FIELD

The present invention relates to the recording, storage and reading of magnetic data, particularly rotatable magnetic recording media, such as thin film magnetic disks having textured surfaces for contact with cooperating magnetic transducing heads. The invention has particular applicability to high density magnetic recording media exhibiting low noise, reduced flying heights and high coercivity.

BACKGROUND ART

Magnetic disks and disk drives are conventionally employed for storing data in magnetizable form. Typically, one or more disks are rotated on a central axis in combination with data transducing heads positioned in close proximity to the recording surfaces of the disks and moved generally radially with respect thereto. Magnetic disks are usually housed in a magnetic disk unit in a stationary state with a magnetic head having a specific load elastically in contact with and pressed against the surface of the disk. It is extremely difficult to produce a magnetic recording medium for ultra-high density recording having suitable magnetic properties, such as high coercivity, e.g., greater than 2500 Oersteads, and a high overwrite, e.g., about 40 dB, while at the same time exhibiting suitable mechanical properties for read-write performance, such as a small glide height avalanche, e.g., about 0.75 to about 0.85 μm.

In operation, the magnetic disk is normally driven by the contact start stop (CSS) method, wherein the head begins to slide against the surface of the disk as the disk begins to rotate. Upon reaching a predetermined high rotational speed, the head floats in air at a predetermined distance from the surface of the disk due to dynamic pressure effects caused by the air flow generated between the sliding surface of the head and the disk. During reading and recording operations, the transducing head is maintained at a controlled distance from the recording surface, supported on a bearing of air as the disk rotates. The magnetic head unit is arranged such that the head can be freely moved in both the circumferential and radial directions of the disk in this floating state allowing data to be recorded on and retrieved from the surface of the disk at a desired position.

Upon terminating operation of the disk drive, the rotational speed of the disk decreases and the head begins to slide against the surface of the disk again and eventually stops in contact with and pressing against the disk. Thus, the transducing head contacts the recording surface whenever the disk is stationary, accelerated from a stop and during deceleration just prior to completely stopping. Each time the head and disk assembly is driven, the sliding surface of the head repeats the cyclic operation consisting of stopping, sliding against the surface of the disk, floating in the air, sliding against the surface of the disk and stopping.

It is considered desirable during reading and recording operations to maintain each transducing head as close to its associated recording surface as possible, i.e., to minimize the flying height of the head. This objective becomes particularly significant as the areal recording density increases. The areal density (Mbits/in$^2$) is the recording density per unit area and is equal to the track density (TPI) in terms of tracks per inch times (×) the linear density (BPI) in terms of bits per inch. Thus, a smooth recording surface is preferred, as well as a smooth opposing surface of the associated transducing head, thereby permitting the head and the disk to be positioned in closer proximity with an attendant increase in predictability and consistent behavior of the air bearing supporting the head. However, another factor operates against that objective. If the head surface and recording surface are too flat, the precision match of these surfaces gives rise to excessive stiction and friction during the start up and stopping phases, thereby causing wear to the head and recording surfaces eventually leading to what is referred to as a "head crash." Thus, there are competing goals of reduced head/disk friction and minimum transducer flying height.

In order to satisfy these competing objectives, the recording surfaces of magnetic disks are conventionally provided with a roughened surface to reduce the head/disk friction by techniques referred to as "texturing." Conventional texturing techniques involve polishing the surface of a disk substrate to provide a texture thereon prior to subsequent deposition of coatings, such as an underlayer, magnetic layer, carbon overcoat and lubricant topcoat, wherein the textured surface on the substrate is reproduced on the surface of the magnetic disk.

Figure 1:
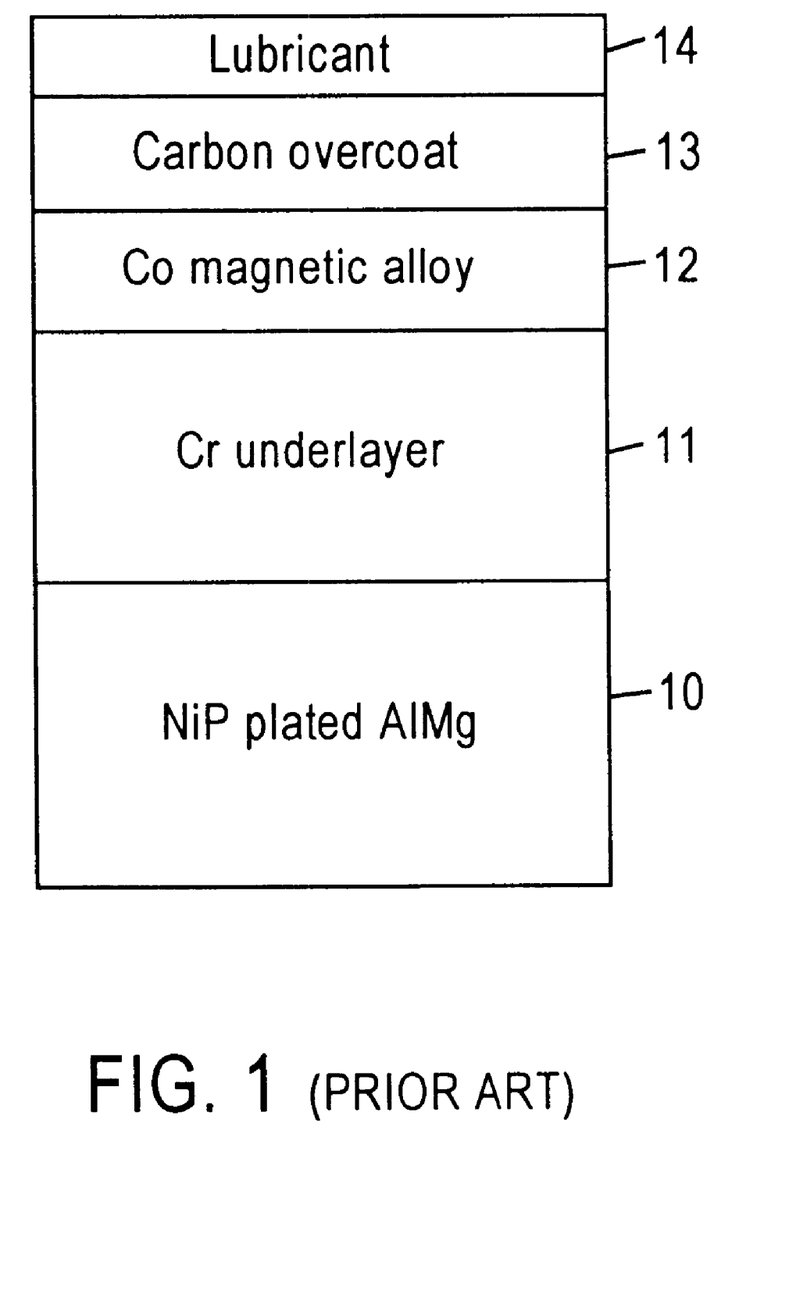
FIG. 1 schematically depicts a conventional magnetic recording medium structure.

A typical magnetic recording medium is depicted in FIG. 1 and comprises a substrate 10, typically an aluminum (Al) -base alloy, such as an aluminum-magnesium (Al—Mg) alloy, chemically plated with a layer of amorphous nickel-phosphorous (NiP). Substrate 10 typically contains sequentially deposited thereon a chromium (Cr) underlayer 11, a cobalt (Co)-base alloy magnetic layer 12, a protective carbon overcoat 13 and a lubricant topcoat 14. Cr underlayer 11, Co-base alloy magnetic layer 12 and protective carbon overcoat 13 are typically deposited by sputtering techniques. Conventional Al-alloy substrates are provided with a NiD chemical plating, typically at a thickness greater than about 10,000 Å, primarily to increase the hardness of the Al substrate, serving as a suitable surface for polishing to provide the requisite surface roughness or texture, which is substantially reproduced on the disk surface.

In addition, increasingly high density and large-capacity magnetic disks require increasingly small flying heights, i.e., the distance by which the head floats above the surface of the disk in the CSS drive. The requirement to further reduce the flying height of the head imposed by increasingly higher recording density and capacity render it particularly difficult to satisfy the requirements for controlled texturing to avoid head crash.

Conventional techniques for providing a disk substrate with a textured surface comprise a mechanical operation, such as polishing. See, for example, Nakamura et al., U.S. Pat. No. 5,202,810. Conventional mechanical texturing techniques are attendant with numerous disadvantages. For example, it is extremely difficult to provide a clean textured surface due to debris formed by mechanical abrasions.

Moreover, the surface inevitably becomes scratched during mechanical operations, which contributes to poor glide characteristics and higher defects. In addition, various desirable substrates are difficult to process by mechanical texturing. This undesirably limiting facet of mechanical texturing, virtually excludes the use of many inexpensive substrates as well as conductive graphite substrates which facilitate achieving high coercivities.

Alternative texturing techniques to mechanical processing have been attempted. One such alternative to mechanical texturing involves the use of lasers. See, for example, Ranjan et al., U.S. Pat. No. 5,062,021. Another alternative to mechanical texturing is disclosed by Lal et al., U.S. Pat. No. 5,166,006, and involves chemical etching. Such alternative techniques have proven less than successful, in that it is extremely difficult to provide repeatable and controllable textured patterns on non-metallic substrates, such as glass, glass-ceramic materials and electrically conductive graphites. In addition, laser textured substrates also require cleaning.

In copending U.S. patent application Ser. No. 08/608,072 filed on Feb. 28, 1996, now U.S. Pat. No. 5,718,811, issued Feb. 17, 1998, a magnetic recording medium is disclosed which has a textured surface formed by sputtering a metallic layer, such as titanium or a titanium alloy, on a non-magnetic substrate, inclusive of a glass, glass-ceramics materials and NiP chemically plated Ni—Mg alloy substrates. It has, however, been found difficult to produce a magnetic recording medium having a suitably high coercivity greater than 2500 Oersteads, such as greater than 3000 Oersteads, particularly greater than 3300 Oersteads, with a sputtered textured layer. In addition, since the topography of the sputtered layer is greatly dependent upon the underlying layer, e.g., substrate, on which it is deposited, process parameters must be optimized for each different type of underlying material, thereby decreasing production throughput. Without such optimization of process parameters, consistently reproducible results are difficult to achieve.

The requirements for high areal recording density impose increasingly greater requirements on thin film magnetic recording media in terms of coercivity, remanent squareness, low medium noise and narrow track recording performance. It is extremely difficult to produce a magnetic recording medium satisfying such demanding requirements, particularly a high density magnetic rigid disk medium for longitudinal recording.

The linear recording density can be increased by increasing the coercivity of the magnetic recording medium. However, this objective can only be accomplished by decreasing the medium noise, as by maintaining very fine magnetically noncoupled grains. Medium noise is a dominant factor restricting increased recording density of high density magnetic hard disk drives. Medium noise in thin films is attributed primarily to inhomogeneous grain size and intergranular exchange coupling. Therefore, in order to increase linear density, medium noise must be minimized by suitable microstructure control.

It is recognized that the relevant magnetic properties, such as coercivity (Hc), magnetic remanence (Mr) and coercive squareness (S*), which are critical to the performance of a Co base alloy magnetic thin film, depend primarily on the microstructure of the magnetic layer which, in turn, is influenced by the underlayer on which it is deposited. Conventional underlayers include Cr, molybdenum (Mo), tungsten (W), titanium (Ti), chromium-vanadium (CrV) as well as Cr alloyed with various substitutional elements. It is recognized that underlayers having a fine grain structure are highly desirable, particularly for growing fine grains of hexagonal close packed (HCP) Co deposited thereon.

It has been reported that nickel-aluminum (NiAl) films exhibit a grain size which is smaller than similarly deposited Cr films which are the underlayer of choice in producing conventional magnetic recording media. Li-Lien Lee et al., "NiAl Underlayers For CoCrTa Magnetic Thin Films", IEEE Transactions on Magnetics, Vol. 30, No. 6, pp. 3951–3953, 1994.

Figure 2:
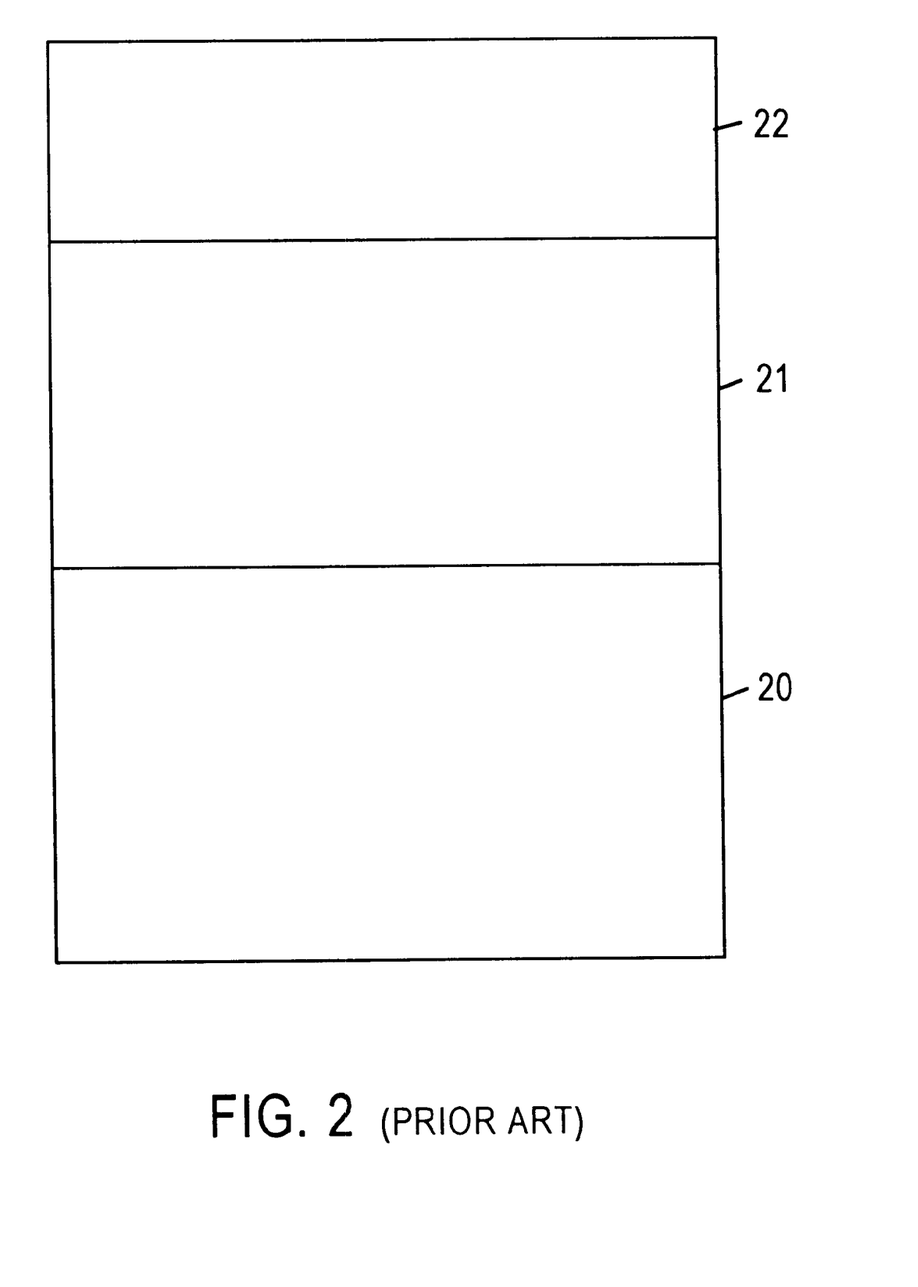
FIG. 2 schematically depicts a prior art magnetic recording medium containing an NiAl underlayer.

Accordingly, NiAl thin films are potential candidates as underlayers for magnetic recording media for high density longitudinal magnetic recording. Such a magnetic recording medium is schematically depicted in FIG. 2 and comprises substrate 20, NiAl underlayer 21 and cobalt alloy magnetic layer 22. However, it was found that the coercivity of a magnetic recording medium comprising an NiAl underlayer, such as that depicted in the FIG. 2, is too low for high density recording, e.g. about 2000 Oersteds.

Lee et al. subsequently reported that the coercivity of a magnetic recording medium comprising an NiAl underlayer can be significantly enhanced by depositing a plurality of underlayers containing alternative NiAl and Cr layers rather than a single NiAl underlayer. Li-Lien Lee et al., "Effects of Cr Intermediate Layers on CoCrPt Thin Film Media on NiAl Underlayers," Vol. 31, No. 6, November 1995, pp. 2728–2730. Such a magnetic recording medium comprising an alternative NiAl layer and Cr layer composite structure is schematically illustrated in FIG. 3.

Figure 3:
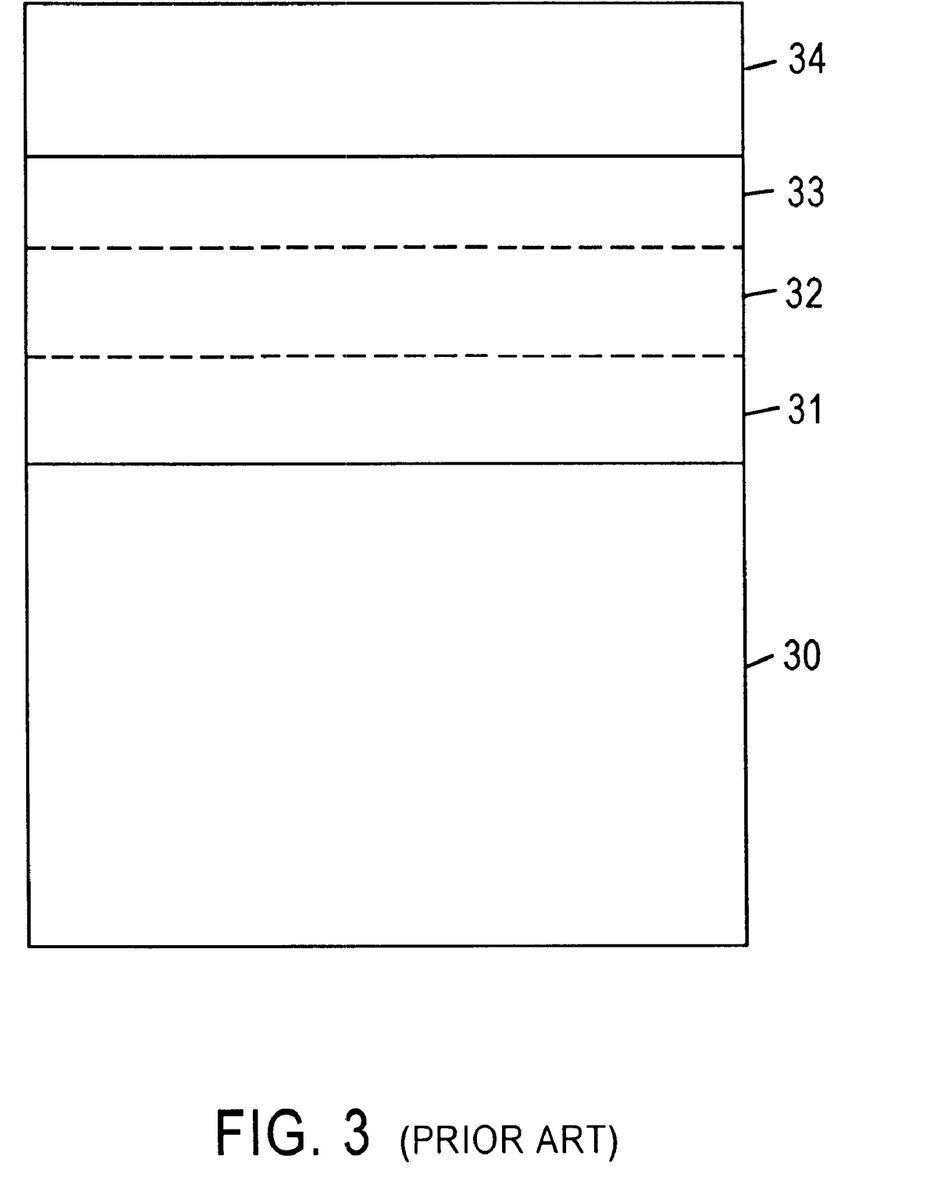
FIG. 3 schematically depicts a prior art magnetic recording medium comprising a composite NiAl/Cr underlayer structure.

Adverting to FIG. 3, the depicted magnetic recording medium comprises substrate 30 having sequentially formed thereon Cr sub-underlayer 31, NiAl underlayer 32, Cr intermediate layer 33, and Co alloy magnetic layer 34. It was found, however, that such a magnetic recording medium is characterized by an underlayer structure exhibiting a (110)-dominant crystallographic orientation which does not induce the preferred (11$\bar{2}$0)-dominant crystallographic orientation in the subsequently deposited Co alloy magnetic layer and is believed to contribute to increased media noise. Li-Lien Lee et al. were able to obtain an underlayer exhibiting a (200)-dominant crystallographic orientation by initially depositing a Cr sub-underlayer directly on the non-magnetic substrate at an undesirably high temperature of about 260° C. using radio frequency (RF) sputtering. However, deposition of a Cr sub-underlayer at such an elevated temperature undesirably results in significantly larger grains than grains resulting from deposition at lower temperatures, e.g. approximating room temperature (25° C.). The formation of larger grains is inconsistent with the very reason for employing NiAl as an underlayer. On the other hand, it is very difficult to obtain Cr (200) crystallographic orientation, even at elevated temperature such as 260° C., on glass and glass ceramic substrates using direct current (DC) magnetron sputtering, which is widely employed in the magnetic recording media industry.

Figure 4:
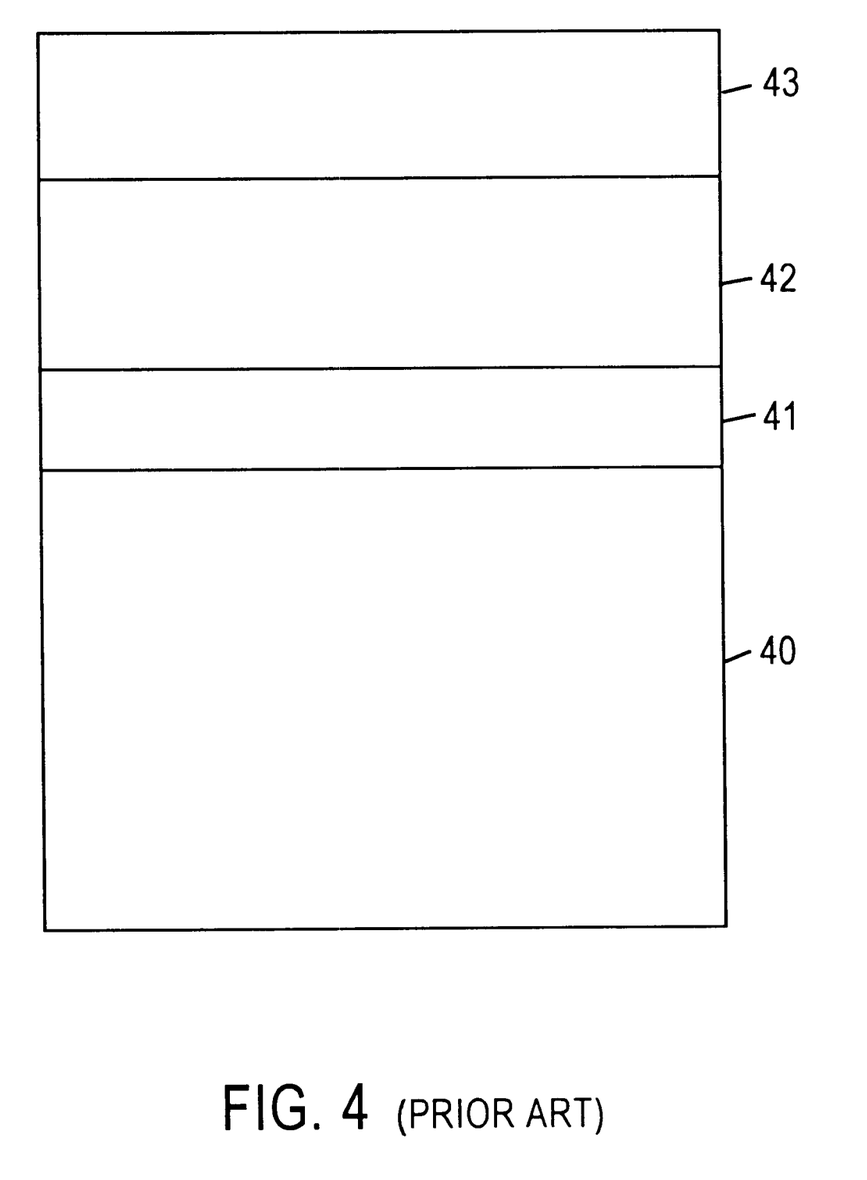
FIG. 4 schematically depicts a prior art magnetic recording medium comprising an NiAl underlayer and MgO seed layer.

Li-Lien Lee et al. recognized the undesirability of resorting to high deposition temperatures to obtain a (200)-dominant crystallographic orientation in the underlayer structure. It was subsequently reported that an underlayer structure exhibiting a (200)-dominant crystallographic orientation was obtained by depositing a magnesium oxide (MgO) seed layer using radio frequency (RF) sputtering. Li-Lien Lee et al., "Seed layer induced (002) crystallographic texture in NiAl underlayers," J. Appl. Phys. 79 (8), Apr. 15, 1996, pp. 4902–4904; and David E. Laughlin et al., "The Control and Characterization of the Crystallographic Texture of the Longitudinal Thin Film Recording Media," IEEE Transactions on Magnetics, Vol. 32, No. 5, September 1996, pp. 3632–3637. Such a magnetic recording medium comprising a MgO seed layer and NiAl underlayer is schematically illustrated in FIG. 4 and comprises MgO seed layer 41 deposited on substrate 40, NiAl underlayer 42 deposited on MgO seed layer 41, and cobalt alloy magnetic layer 43 deposited on NiAl underlayer 42. Such a magnetic recording medium, however is not commercially viable from an economic standpoint, because sputtering systems in place throughout the industry making magnetic recording media with the conventional structure of magnetic layers epitaxially formed on underlayers are based upon direct current (DC) sputtering. Accordingly, RF sputtering an MgO seed layer is not economically viable.

On the other hand, the objective of having a (200) crystallographic orientation in the underlayers is to induce ($11\bar{2}0$) crystallographic orientation in the Co alloy layers. Even through media comprising an MgO seed layer and NiAl underlayer has (200) crystallographic orientation in the underlayer, it does not have a dominant ($11\bar{2}0$) crystallographic orientation in the Co alloy layer, according to Laughlin et al., "The Control and Characterization of the Crystallographic Texture of the Longitudinal Thin Film Recording Media," IEEE Transaction on Magnetics, Vol. 32, No. 5, September 1996, p. 3634. Laughlin et al. reported that the grain-to-grain epitaxial relationship between the (002) NiAl and the CoCrPt film is found to be [$10\bar{1}1$] CoCrPt// [0011] NiAl, and ($12\bar{1}0$) CoCrPt//(100) NiAl, or ($12\bar{1}0$) CoCrPt//(010) NiAl. In other words, Laughlin et al. reported that there is no ($11\bar{2}0$) CoCrPt//(200) NiAl epitaxial relationship found in the films with MgO seed layers and NiAl underlayers. Rather, (200) orientation is identical with (002) orientation. When an FeAl underlayer is used instead of NiAl, it was reported that the (200) FeAl underlayer can only induce a weak ($11\bar{2}0$) textured CoCrPt by employing a MgO seed layer or a (200) textured Cr seed layer. Li-Lien Lee et al., "FeAl underlayers for CoCrPt thin film longitudinal media," CC-01, 41st Annual Conference on Magnetism and Magnetic Materials, Atlanta, Ga., Nov. 12–15, 1996

Co-pending application Ser. No. 08/699,759, filed on Aug. 20, 1996 now U.S. Pat. No. 5,866,227, issued Feb. 2, 1999, discloses that Cr films deposited on surface oxidized NiP layers experience smaller grains than Cr films deposited on non-oxidized NiP layers. Co-pending application Ser. No. 08/586,529, filed on Jan. 16, 1996, discloses a method for depositing Cr films on surface oxidized NiP films, wherein the deposited Cr films exhibit a (200)-dominant crystallographic orientation.

In copending application Ser. No. 08/945,084 filed on Oct. 17, 1997 a magnetic recording medium having high coercivity is disclosed, which magnetic recording medium comprises an seed layer having an oxidized surface formed on a non-magnetic substrate, a chromium-containing sub-underlayer on the oxidized surface of the seed layer, a nickel-aluminum or iron-aluminum underlayer, a chromium-containing intermediate layer on the underlayer and a magnetic layer on the intermediate layer.

There exists a need for magnetic recording media with repeatable and controllable sputter textured surface patterns exhibiting improved floating and improved sliding-wear-resistant characteristics, low noise and high coercivity.

DISCLOSURE OF THE INVENTION

An object of the present invention is a textured magnetic recording medium suitable for high density longitudinal magnetic recording which exhibits low noise, high coercivity, improved flying characteristics, improved sliding-wear-resistant characteristics.

Another object of the present invention is a method of manufacturing a textured magnetic recording medium suitable for high density longitudinal magnetic recording which exhibits low noise, high coercivity, improved floating characteristics, improved sliding-wear-resistant characteristics.

A further object of the present invention is an apparatus for sequentially sputter depositing a plurality of layers to form a magnetic recording medium exhibiting high coercivity and suitable for high density longitudinal magnetic recording.

According to the present invention, the foregoing and other objects are achieved in part by a magnetic recording medium, comprising: a non-magnetic substrate; a sputtered buffer layer on the substrate; a sputtered metallic bump layer, comprising a plurality of protrusions, on the buffer layer; an underlayer formed on the bump layer; and a magnetic layer on the underlayer.

Another aspect of the present invention is a magnetic recording medium, comprising: a non-magnetic substrate; a sputtered metallic bump layer, comprising a plurality of protrusions, formed on the substrate; an underlayer formed on the bump layer; and a magnetic layer formed on the underlayer, wherein the magnetic recording medium exhibits a coercivity greater than 2500 Oersteads.

A further aspect of the present invention is a magnetic recording medium comprising: a glass or glass-ceramic substrate; a nickel-phosphorous buffer layer on the substrate; a sputtered metallic bump layer, comprising a plurality of protrusions, on the buffer layer; an underlayer on the bump layer; and a magnetic layer on the bump layer.

A further aspect of the present invention is a method of manufacturing a magnetic recording medium, which method comprises: sputtering a buffer layer on a non-magnetic substrate; sputtering a metallic bump layer, comprising a plurality of protrusions, on the buffer layer; sputtering an underlayer on the bump layer; and sputtering a magnetic layer on the bump layer.

Another aspect of the present invention is an apparatus for manufacturing a magnetic recording medium, which apparatus comprises: a load chamber for loading a non-magnetic substrate; a sputtering chamber for depositing a buffer layer on the substrate; a sputtering chamber for depositing a metallic bump layer, comprising a plurality of protrusions, on the buffer layer; a sputtering chamber for depositing an underlayer on the bump layer; and a sputtering chamber for depositing a magnetic layer on the bump layer.

Additional objects and advantages of the present invention will become readily apparent to those skilled in this art from the following detailed description, wherein the embodiments of the invention are described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The present invention constitutes several improvements on the basic sputter texturing technique disclosed in copending application Ser. No. 08/608, 072, now U.S. Pat. No. 5,718,811 which improvements lead to reproducible results independent of the substrate and very high coercivities, in excess of 2500 Oersteads, such as greater than 3000 Oersteads, even greater than 3300 Oersteads. Moreover, these advantages are achieved by an efficient, cost effective method involving a plurality of sequential sputtering procedures. The present invention comprises the resulting improved magnetic recording media, suitable for high density longitudinal magnetic recording, and a method and apparatus for manufacturing such greatly improved magnetic recording media. Advantageously, the present invention is applicable to a wide variety of substrate materials, such as glass, glass-ceramic materials and, significantly, electrically conductive graphite substrates.

In accordance with an embodiment of the present invention, a consistently reproducible sputter textured surface is achieved, independent of the selected non-magnetic substrate, by providing a thin buffer layer on the non-magnetic substrate, thereby isolating the subsequently sputter deposited bump layer from the substrate. In this way, the texture of the bump layer is controlled by controlling the buffer layer, thereby providing enhanced flexibility as to substrate selection without sacrificing production throughput.

The buffer layer of the present invention can comprise a suitable material, such as NiP, Cr or a Cr alloy, such as a CrV alloy. In an embodiment of the present invention, the buffer layer comprises a thin sputtered layer of NiP.

Unlike conventional practices wherein NiP is chemically plated on an AlMg substrate, the NiP buffer layer of the present invention is extremely thin, typically having a thickness of about 50 to about 300 Å, e.g., 150 Å to about 250 Å, as about 200 Å. It has been found that only a thin layer is required to serve as a suitable substrate for obtaining a controllable and reproducible sputter textured bump layer. The conventional NiP plating deposited on an AlMg substrate is significantly different not only in function but in structure, since it is typically plated to a thickness in excess of 10,000 Å and is chemically reacted with the AlMg substrate.

The use of a buffer layer in accordance with the present invention enables the sputter deposited bump layer to be formed on a wide variety of substrates, such as conventional Al-base alloy substrates as well as glass, glass-ceramic materials and, electrically conductive graphites, by inducing formation of a controllable uniform texture. The general applicability of the present invention to a wide variety of substrates offers the economic advantage of selecting relatively shock-resistant glass and glass-ceramic substrates. Glass and glass-ceramic substrates have higher shock resistance and can avoid head slapping problems. Glass and glass-ceramic substrates are, therefore, suitable for hard disk drive designs for portable computer applications. In addition, electrically conductive graphite substrates enhance coercivity.

In accordance with the present invention, after sputter depositing the buffer layer, the substrate is typically heated, as with passby heating, and a textured or bump layer is sputter deposited on the heated buffer layer. The bump layer comprises a metal, such as titanium or a titanium alloy, and exhibits a surface texture comprising a plurality of protrusions with a relatively uniform and controllable size and distribution. The textured surface of relatively uniform protrusions is reproduced on the surface of the magnetic recording medium through the subsequently applied layers, such as an underlayer, magnetic layer, carbon overcoat and lubricant topcoat. The sputtered metallic layer having protrusions extending therefrom is sometimes referred to herein as a "bump layer."

The sputter deposited bump layer formed in accordance with the present invention advantageously provides a textured surface comprising a substantially uniform pattern of controlled protrusions controlled to a diameter of about 8,000 Å to about 25,000 Å, such as about 18,000 Å to about 22,000 Å, e.g., about 20,000 Å, and to a height of about 100 Å to about 250 Å, such as about 125 Å to about 175 Å, e.g., about 150 Å. The shape and distribution of the protrusions can be controlled by appropriate adjustment of process parameters, such as the heat input to the substrate and the thickness of the sputtered metallic layer prior to formation of the protrusions. The heat input to the substrate can be controlled by various techniques, as by controlling the speed at which the substrate is passed in proximity to a radiant heater, periodic application of heat energy, induction heating and pulsed laser heating. The particular type of heating means employed can be selected with due consideration to the substrate material.

The optimum thickness of the sputtered metallic layer conducive to formation of protrusions can be determined by controlling the target power during sputtering and substrate travel speed. It is advantageous to eschew the application of a bias on the metallic target during sputtering. The application of a bias to a metallic target, particularly a Ti or Ti-base alloy target, diminishes the formation of protrusions and renders them irregular in shape and distribution.

With knowledge of the relevant result effective variables, i.e., substrate heating rate and thickness of the sputtered metallic layer prior to formation of protrusions, one having ordinary skill in the art could easily optimize such process parameters for a particular application. For example, when depositing Ti or a Ti-base alloy, the thickness of the Ti-containing layer can be advantageously controlled between about 600 Å to about 1300 Å.

In conventional manufacturing practices, a plurality of substrates are provided on a pallet, and various layers of the magnetic recording medium sequentially sputtered thereon, e.g., underlayer, magnetic layer and carbon overcoat. Accordingly, in accordance with the present invention, the heat input to the substrate can be controlled by varying the pallet travel speed as it passes in proximity to a heating source, such as a quartz radiant heater.

Protrusion formation is enhanced by heating the substrate in a dynamic manner to create a temperature gradient across the surface of the substrate. Thus, when depositing a Ti or Ti-base alloy on a NiP buffer layer in accordance with the present invention, the substrate is moved by a heating source, such as a quartz silicon radiant heater, at a speed sufficient to elevate the substrate to the desired temperature range. The optimum pallet speed can be determined in a particular situation to achieve a desired temperature gradient.

It was found that Ti-base alloy protrusions are generally larger and less dense with a higher temperature gradient, and smaller and less dense with a lower temperature gradient on a NiP buffer layer. A high temperature gradient can be achieved by increasing the pallet speed, while a lower temperature gradient can be achieved by reducing the pallet speed. The thickness of the sputtered Ti-base alloy layer prior to formation of protrusions can be controlled to produce higher and larger bumps by increasing the Ti-base alloy target power at a fixed pallet speed. For a particular situation, the amount of the heat input and pallet speed can be varied to control the size and distribution of protrusions.

The exact mechanism by which dynamic heating contributes to or enhances the formation of protrusions during sputtering is not known. However, it is believed that protrusion formation depends on localized heating/cooling of the substrate, i.e., a localized temperature gradient effect. As a maximum localized temperature gradient is established, the metal, such as Ti, becomes sufficiently mobile to grow and form larger protrusions. Lateral growth is more rapid than vertical growth due to the effects of surface tension, thereby decreasing the density of protrusions. However, increasing power input appears to cause the localized temperature gradient to drop and, hence, the protrusions become smaller and denser.

In accordance with the present invention, a magnetic recording medium is provided which exhibits a relatively uniform texture so that sub-micro-inch glide performance for a substrate smoothness less than about 5 Å and CSS performance equivalent to a mechanically textured disk with a center line average surface roughness (Ra) of in excess of 30 Å is achieved. Generally, the magnetic recording medium in accordance with the present invention exhibits a center line average surface roughness (Ra) of about 7 Å to about 32 Å, and a surface peak roughness (Rp) of about 30 Å to about 200 Å. The magnetic media formed in accordance with the present invention, therefore, exhibit desirable glide characteristics and CSS performance.

In another embodiment of the present invention, high coercivities are achieved by forming, as by sputter deposition, an underlayer comprising a NiAl or FeAl layer on the sputter deposited bump layer, with or without an underlying buffer layer. It has been found particularly suitable to employ a composite underlayer comprising at least one layer of Cr or a Cr alloy and a NiAl layer. For example, high coercivities are achieved by forming a composite underlayer comprising a first layer of Cr or a Cr alloy, an intermediate NiAl alloy layer on the first layer and a third layer of Cr or a Cr alloy on the intermediate NiAl alloy layer. A composite underlayer comprising a first layer of Cr, an intermediate NiAl layer on the first Cr layer, and a third layer of a CrV alloy on the intermediate NiAl alloy layer has been found particularly suitable in achieving high coercivities.

Figure 5:
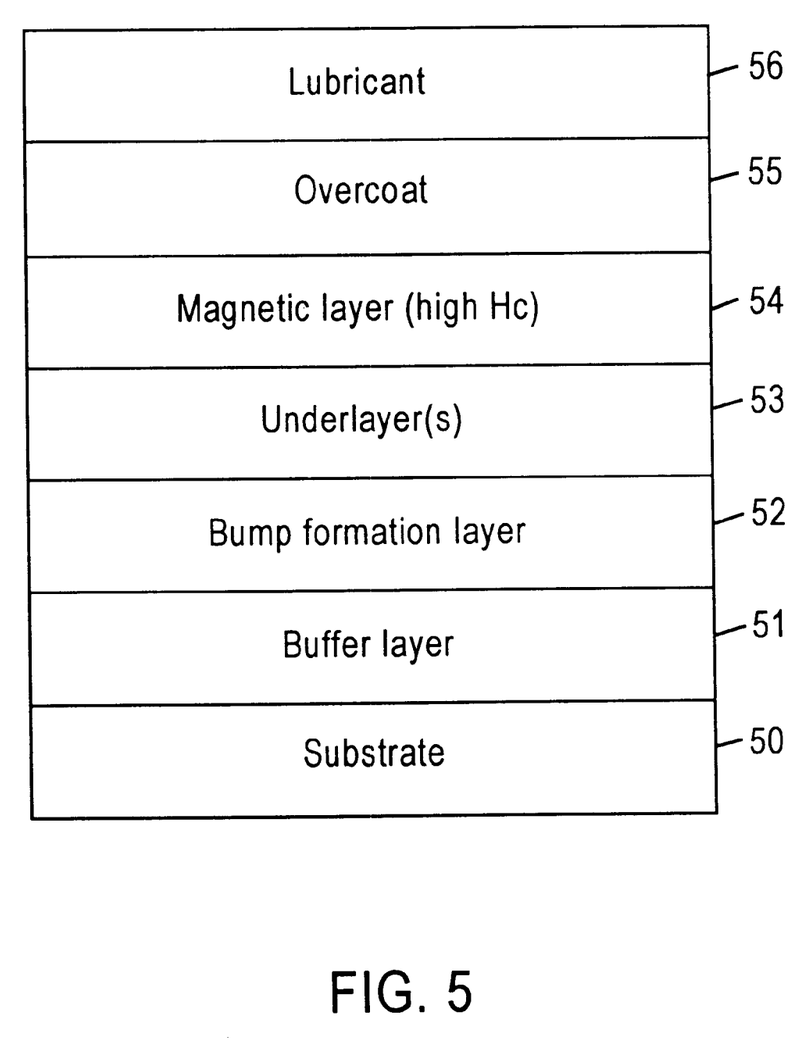
FIG. 5 schematically depicts a magnetic recording medium structure in accordance with the present invention.

An embodiment of the present invention is schematically depicted in FIG. 5 and comprises substrate 50 and a plurality of layers formed thereon. As one having ordinary skill in the art would recognize, a magnetic recording medium typically comprises a substrate with a plurality of layers sequentially formed on each side of the substrate. However, for simplicity, only layers formed on the upper side of the substrate are illustrated in FIG. 5, it being understood that a similar sequence of layers is formed on both sides of the substrate.

Adverting to FIG. 5, buffer layer 51 is formed on substrate 50. Buffer layer 51 is suitably thin to serve as a consistent uniform surface for obtaining a desired topography on the bump layer subsequently sputter deposited thereon. Advantageously, buffer layer 51 is sputtered to a thickness between of about 300 Å to about 2,000 Å, such as a 450 Å to about 1,500 Å, e.g., about 900 Å, and can comprise NiP, Cr or a Cr alloy. Advantageous results have been obtained using an NiP buffer layer.

Bump layer 52 is then sputter deposited on buffer layer 51. Bump layer 52 typically comprises Ti or a Ti alloy in the form of a uniform layer with protrusions extending therefrom to form a substantially uniform controlled textured surface. An underlayer 53, comprising an NiAl or FeAl layer, is then formed on the bump layer 52. Particularly high coercivities are achieved by depositing a composite underlayer comprising at least one Cr or Cr alloy layer. For example, coercivities in excess of 3300 Oersteads have been achieved by depositing a composite underlayer comprising a first layer of Cr, depositing a NiAl intermediate layer on the first layer, and depositing a third layer of a CrV alloy on the intermediate NiAl alloy layer. A magnetic layer 54 is then deposited on the underlayer 53. A carbon overcoat 55 and lubricant topcoat 56 are then sequentially deposited on magnetic layer 54.

In accordance with the present invention, the sputter deposited bump layer 52 has a textured surface comprising a relatively uniform distribution of bumps or protrusions having a substantially uniform size and height, which textured surface is substantially reproduced through subsequently applied underlayer 53, magnetic layer 54, carbon overcoat 55 and lubricant topcoat 56. Although any conventional magnetic alloy layer can be employed for magnetic layer 54, such as any of various Co magnetic alloy layers, particularly high coercivities have been achieved employing a magnetic alloy layer comprising a CoCrTaPt magnetic alloy. Significantly, buffer layer 51, bump layer 52, underlayer(s) 53, magnetic layer 54 and carbon overcoat 55 are each sputter deposited, thereby further enhancing production throughput.

Figure 6:
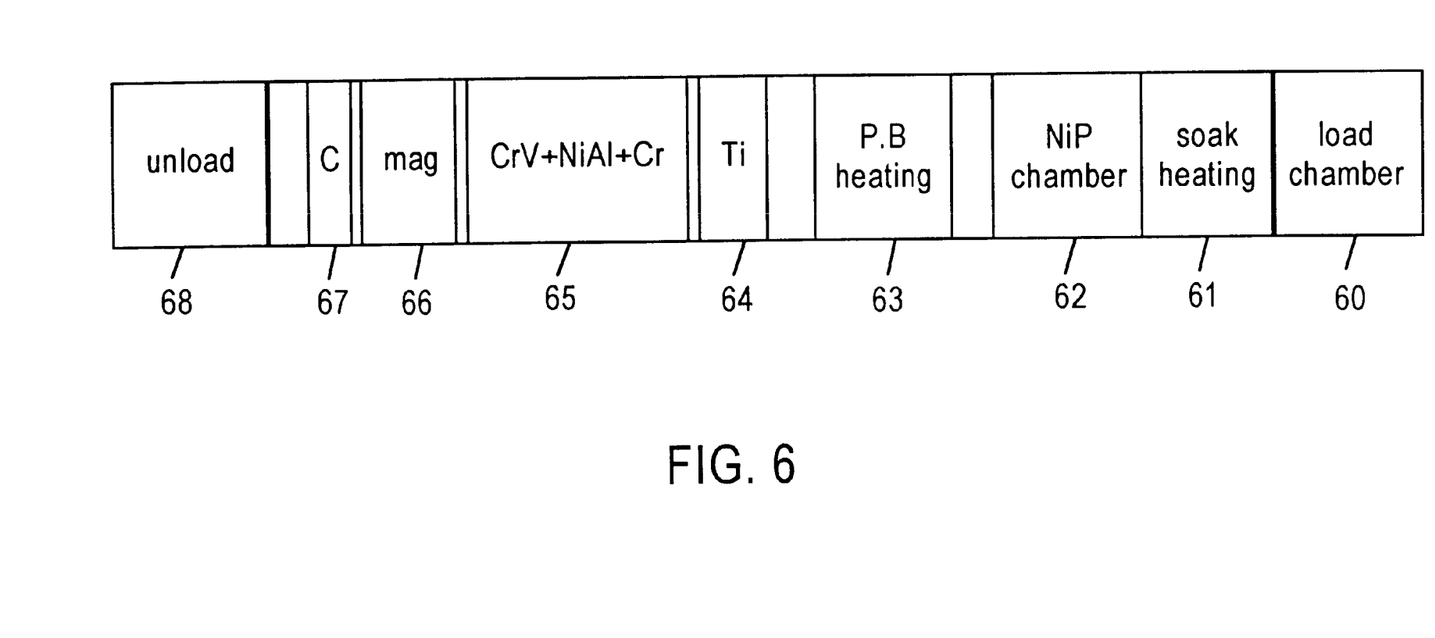
FIG. 6 schematically illustrates a sputtering apparatus in accordance with the present invention.

Another embodiment of the present invention comprises an apparatus for manufacturing a magnetic recording medium, such as that depicted in FIG. 5, except for the lubricant topcoat which is not sputter deposited but applied in a conventional manner as by dissolving a lubricant in an organic solvent and bonding by thermal treatment, ultraviolet (UV) irradiation or soaking. An apparatus in accordance with the present invention is schematically illustrated in FIG. 6 and comprises, sequentially, load chamber 60 in which a substrate is inserted and then passed to heating chamber 61 in which the substrate is heat soaked. The heated substrate is then passed to sputtering chamber 62 in which a buffer layer, e.g., NiP, is sputter deposited on the substrate. The next sequential chamber is heating chamber 63 followed by sputtering chamber 64 wherein a bump layer, such as Ti or a Ti alloy, is sputter deposited on the buffer layer to form a textured surface. The intermediate article comprising the substrate, buffer layer and bump layer is then passed to another sputtering chamber 65 in which the underlayer is deposited. Sputtering chamber 65 in FIG. 6 is structured to deposit a composite underlayer by sequentially depositing a first layer comprising Cr, an intermediate layer comprising a NiAl alloy and a third layer comprising a CrV alloy. The intermediate article containing the substrate, buffer layer, bump layer and composite underlayer is then passed to another sputtering chamber 66 in which a magnetic alloy layer is sputter deposited on the composite underlayer, and then to sputtering chamber 67 wherein a protective overcoat, typically a carbon protective overcoat, is sputter deposited on the magnetic alloy layer. The resulting magnetic recording medium is passed to the unload chamber 68 and removed for subsequent processing, as by applying a conventional lubricant topcoat thereto.

The methodology of the present invention advantageously enables the application of all layers or a magnetic recording medium, except the lubricant topcoat, by sputter deposition, thereby improving throughput and yield. Additionally, the present invention is applicable to a wide variety of substrate materials, such as glass, glass-ceramic materials or electrically conductive graphite. Glass-ceramic materials are typically formed by a heat treatment of the surface to form a thin crystallized layer of ceramic thereon. Electrically conductive graphites are desirable for obtaining high coercivity.

EXAMPLE

A magnetic recording medium was produced in accordance with the present invention utilizing the apparatus depicted in FIG. 6. A glass substrate was placed on a pallet in load chamber 60, passed to soak/heating chamber 61 wherein it was heated for about 5 seconds at about 2.3 kw heating power. The heated substrate was then passed to sputtering chamber 61 wherein a NiP buffer layer was deposited at 3.6 kw with a pallet speed of 1 (fpm) to a thickness of about 900 Å. In passby heating chamber 63, the pallet was moved at a speed of about 5 fpm employing 20% power. In sputtering chamber 64, a Ti bump layer was deposited at a power of 5 kw with a pallet speed of 1 fpm.

Figure 7:
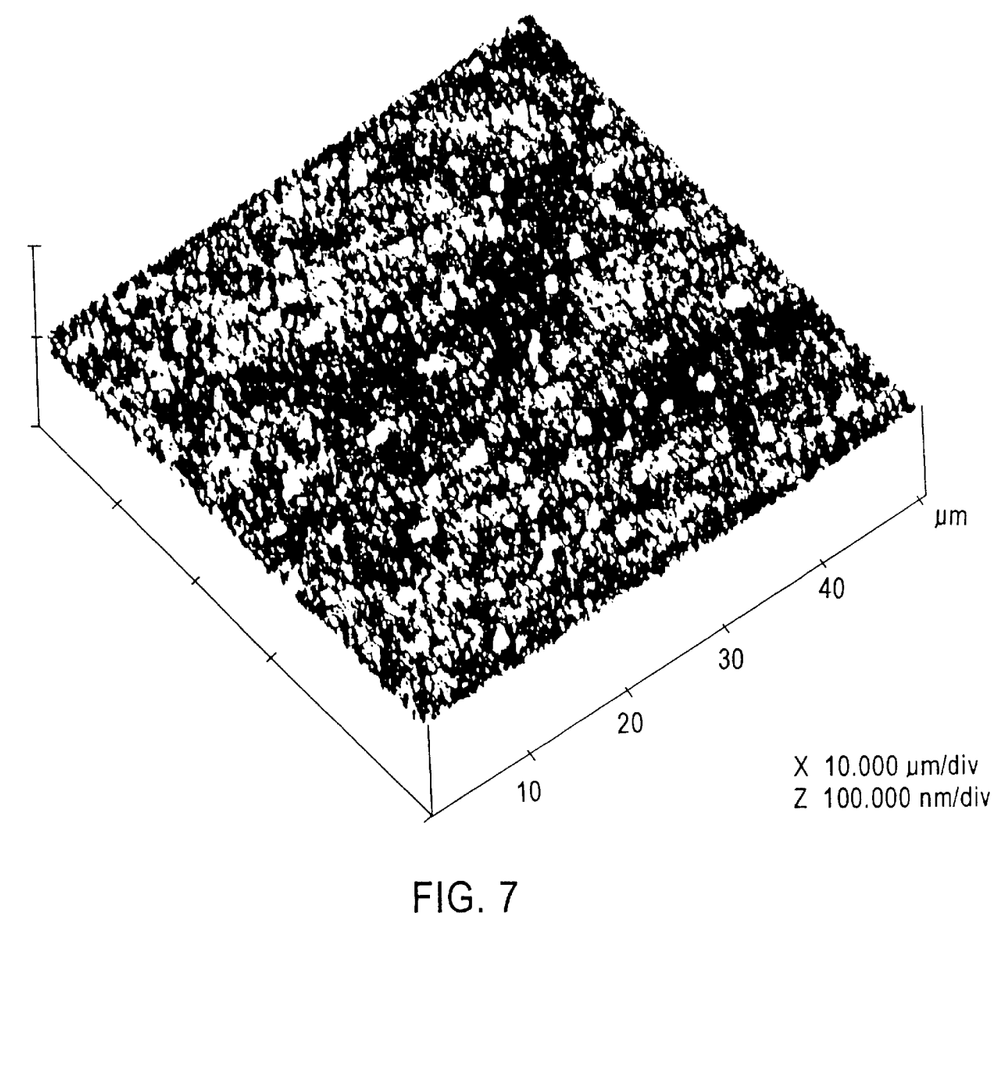
FIG. 7 is an atomic force microscope (AFM) image of titanium protrusions formed on an NiP buffer layer in accordance with the present invention.
Figure 8:
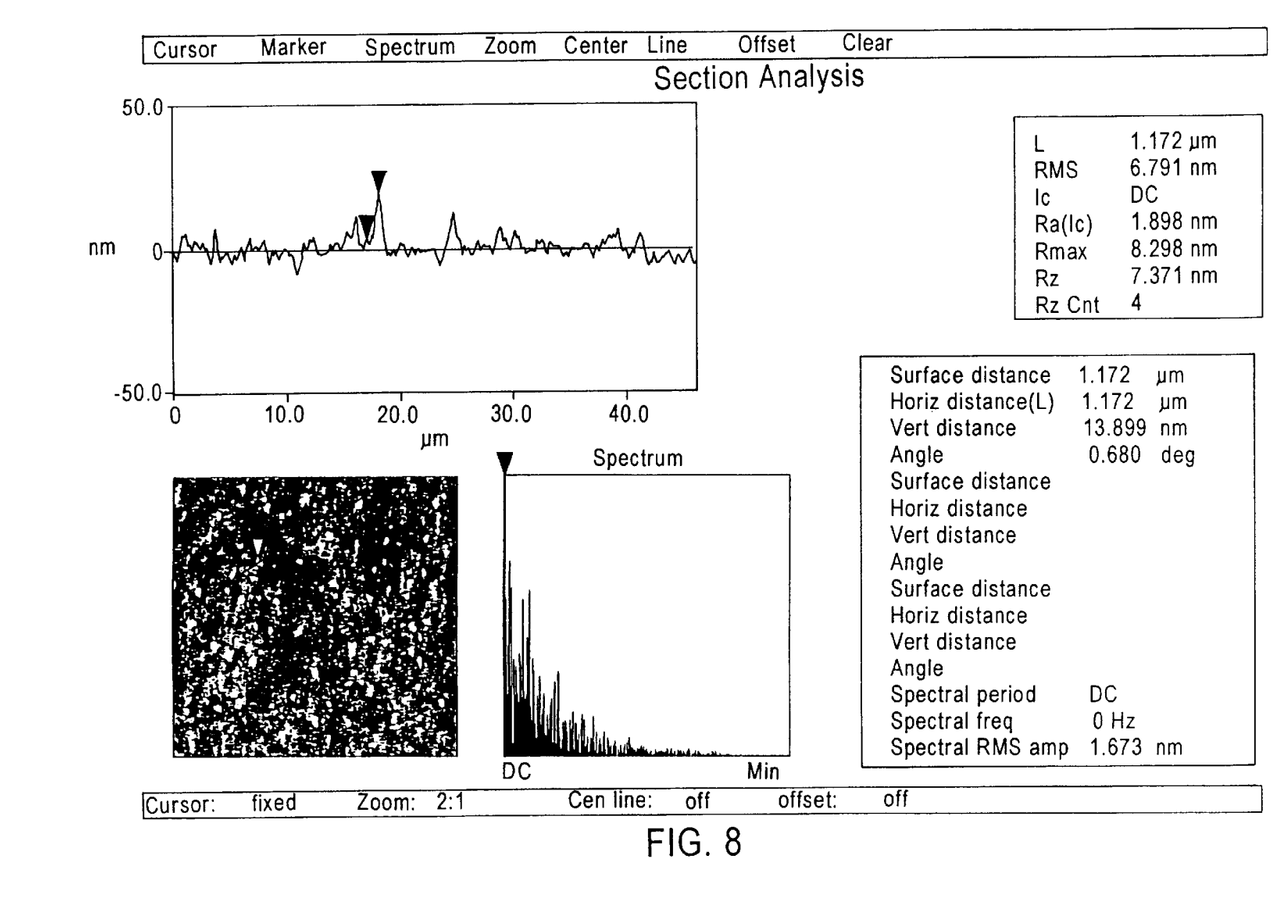
FIG. 8 is a line scan across several titanium protrusions of FIG. 7.

At this point, the surface of the resulting magnetic recording medium was examined by an atomic force microscope (AFM). The AFM image formed is shown in FIG. 7 and illustrates Ti bumps formed on the NiP buffer layer. Adverting to FIG. 8, a line scan across several of the bumps shown in FIG. 7 reveals bumps of about 150 Å in height and 24,000 Å in diameter. The geometry of the bumps and density can be controlled by manipulating various sputtering conditions, e.g., passby heating power, passby speed and bump layer thickness.

A composite underlayer comprising a first Cr layer, a NiAl intermediate layer on the first Cr layer, and a third CrV alloy layer on the NiAl layer, was then deposited in sputtering chamber 65 of the apparatus depicted in FIG. 6, at a pallet speed of about 2 fpm with a target power of about 4 kw, 1 kw and 4 kw for each target (1 pair) respectively. In sputtering chamber 66, a CoCrTaPt magnetic alloy layer was deposited at a pallet speed of about 4.2 fpm with a target power of 4 kw (1 pair). A protective carbon overcoat employing Swamp gas, was then deposited in sputtering chamber 67 at a pallet speed of about 2.5 fpm with a target power of about 2.5 kw (4 pairs).

Figure 9:
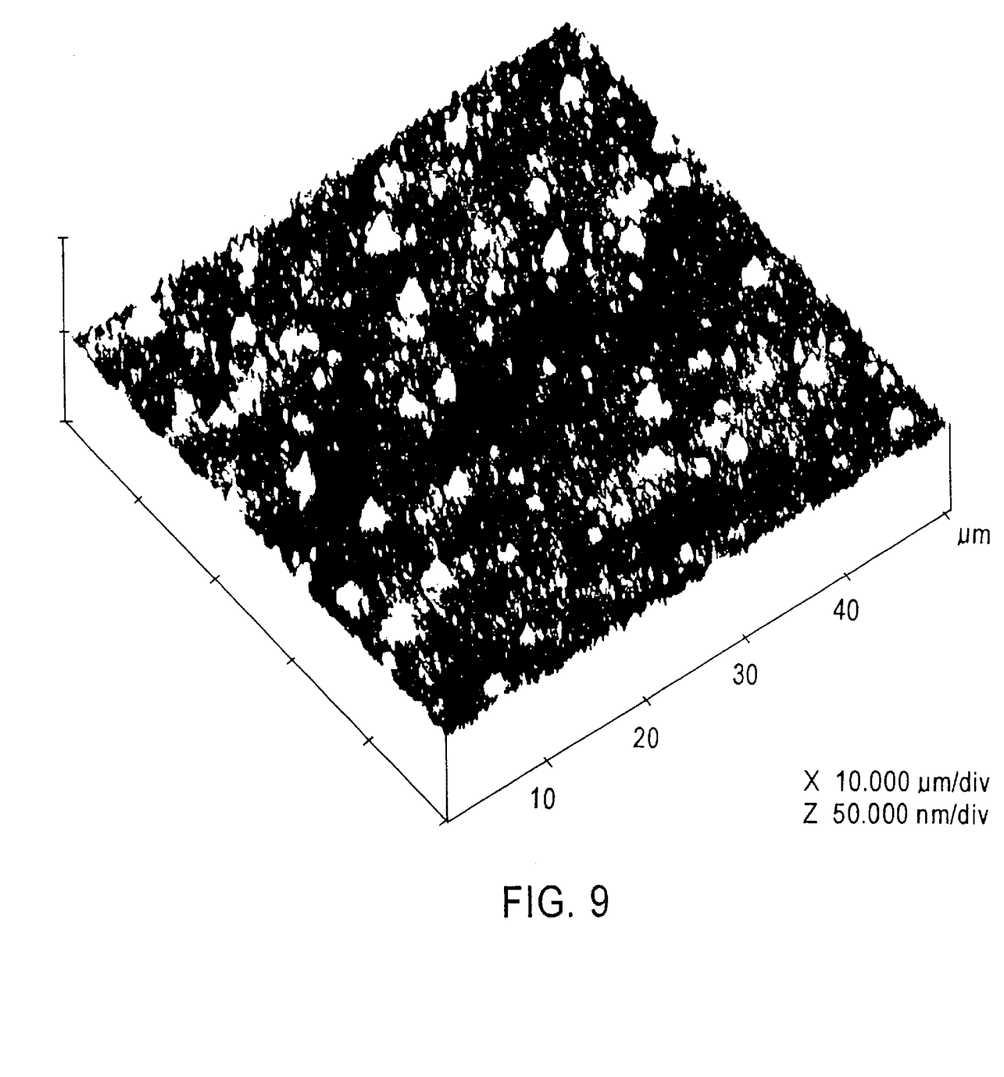
FIG. 9 is an AFM image of a magnetic recording medium surface in accordance with the present invention.
Figure 10:
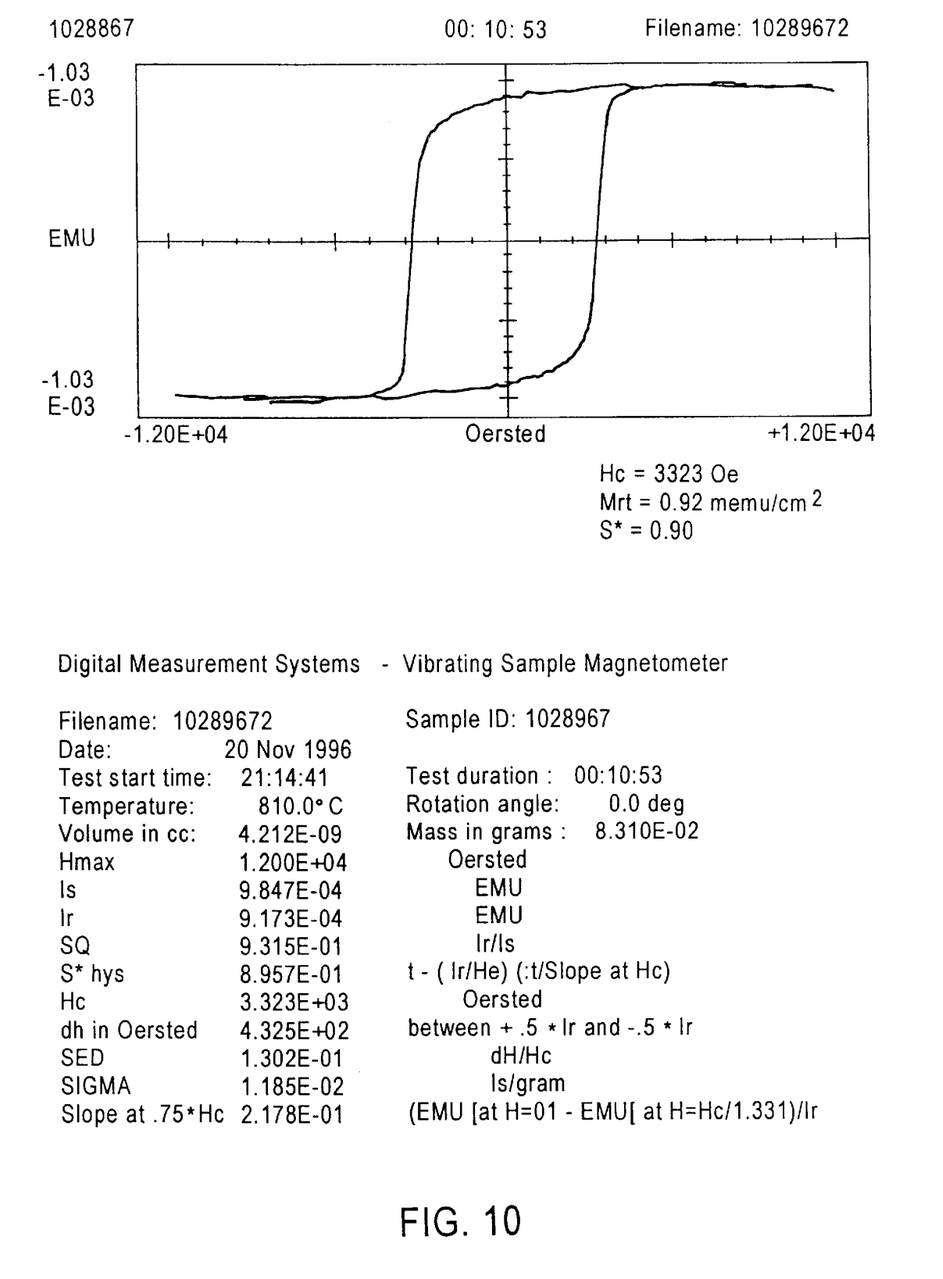
FIG. 10 shows the hysteresis loop obtained from an embodiment of the present invention.

The AFM image shown in FIG. 9 illustrates the surface of the above magnetic recording medium with bumps originating from the Ti bump layer clearly visible. FIG. 10 shows the hysterisis loop obtained from the above Example having a coercivity of about 3323 Oersteads, a Mrt [magnetic remanence (Mr)×thickness (t)] of about 0.9 to memu/cm$^2$, and a coercive squareness (S*) of about 0.9.

Figure 11:
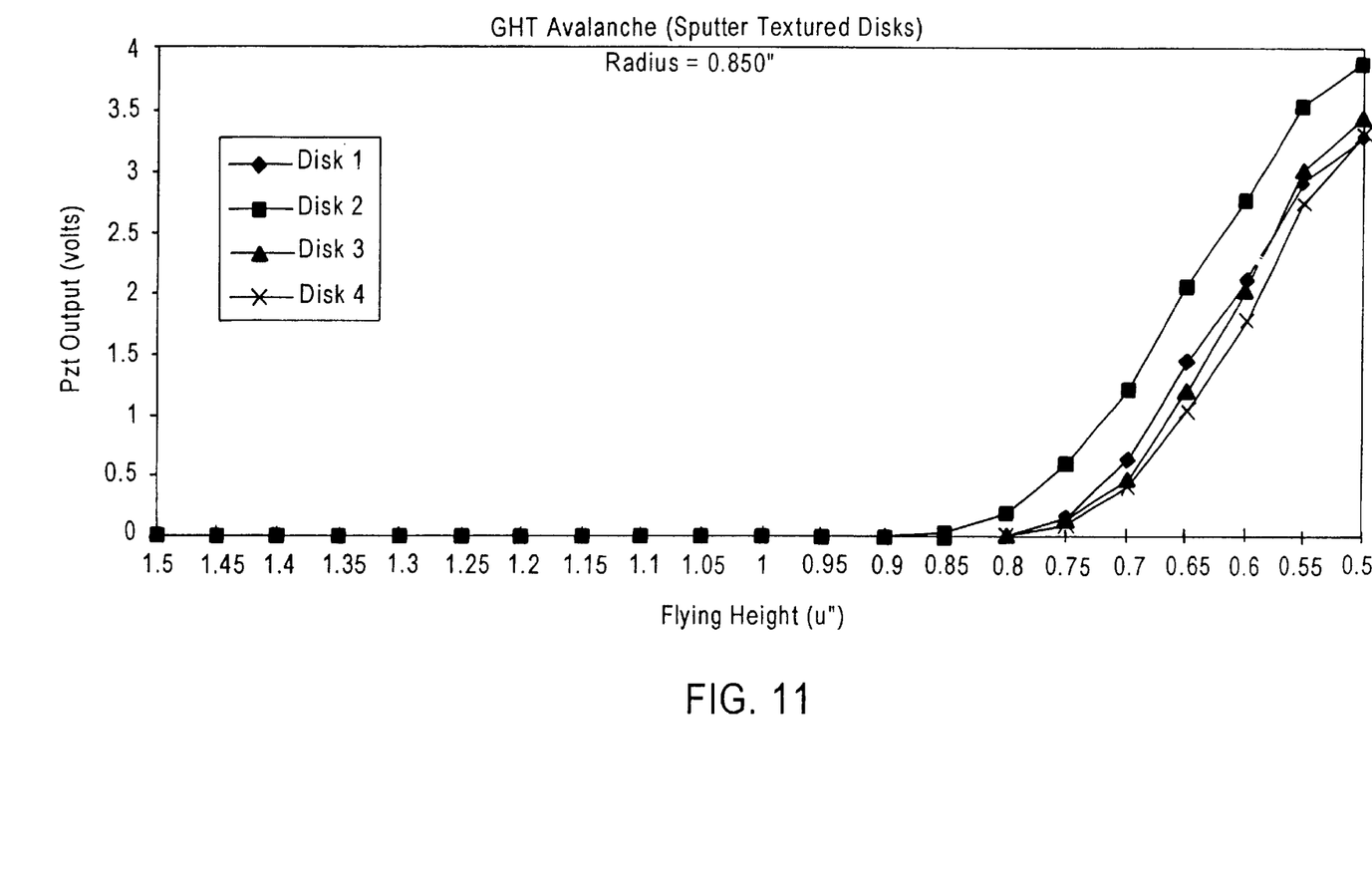
FIG. 11 shows the results of glide height avalanche testing of magnetic recording media produced in accordance with the present invention.

Four additional magnetic recording media were produced in accordance with the present invention and tested for performance. FIG. 11 shows the glide height avalanche test of such four high coercivity magnetic recording media produced by the inventive sputtering method. A small GHA of about 0.70 to about 0.75 micro-inch is consistently obtained. Recording measurements were carried out using an MR head with a write current Iw of about 35 mA (0-p) and a bias current Ib of about 12 mA (0-p) on a Guzik 1701 and ECTS tester. The results show an overwrite of about 35–41 dB and signal to media noise ratio (SMNR) of about 19–21 dB. It was observed that the lower SNMR and smaller overwrite correspond to a higher coercivity, suggesting that writing is limited by head performance. An even larger SMNR is obtained employing a head with a stronger field and sharper field gradient.

Any magnetic alloy conventionally employed in the production of magnetic recording media can be employed in producing the magnetic recording media of the present invention. Such conventional magnetic alloys, include, but are not limited to, cobalt (Co)-base alloys, such as cobalt-chromium (CoCr), cobalt-samarium (CoSm), cobalt-chromium-tantalum (CoCrTa), cobalt-nickel-chromium (CoNiCr), cobalt-chromium-samarium (CoCrSm), cobalt-chromium-tantalum-platinum (CoCrTaPt), cobalt-chromium-platinum (CoCrPt), cobalt-nickel-platinum (CoNiPt), cobalt-nickel-chromium-platinum (CoNiCrPt) and cobalt-chromium-platinum-boron (CoCrPtB). The thickness of the magnetic layer is consistent with conventional practices and manufacturing a magnetic recording medium. Cobalt-base alloys having a thickness of about 100 Å to about 1000 Å, such as 200 Å to about 500 Å, has been found suitable.

The present invention is not limited to the particular materials disclosed herein. Various metals, apart from Ti and Ti-base alloys, can be employed in sputter depositing a bump layer on various substrates, and any of various magnetic materials can be applied to the bump layer with or without an intervening underlayer. Varieties of materials, such as CrMo, CrW, CrTi, CrTa, CrB, CrO, CrTiB, can be used as the buffer layer.

In accordance with the present invention, a protective overcoat can comprise zirconium oxide (ZrO$_2$), carbon, including hydrogenated carbon, silicon carbide (SiC) or a carbon nitride (CN). The protective overcoat is provided at a thickness suitable for protecting the underlying layers, such as about 50 Å to about 300 Å, e.g., 100 Å to about 200 Å. As in conventional magnetic recording media, a layer of the lubricant can be applied on and bonded to the overcoat. The lubricant topcoat can be provided in any suitable thickness, such as about 5 Å to about 50 Å, e.g., 10 Å to about 20 Å.

The present invention provides an efficient method for forming a magnetic recording media having reproducible uniform surface characteristics with desirable glide performance and improved CSS performance, while also exhibiting high coercivity. The present invention enables the production of magnetic recording media with coercivities in excess of 3300 Oersteads, a large SNR, high overwrite, and small glide height avalanche.

Only certain embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A magnetic recording medium, comprising:
   a non-magnetic substrate;
   a sputtered buffer layer, having a thickness of about 50 Å to about 300 Å, on the substrate:
   a sputtered metallic bump layer, comprising a plurality of protrusions, on the buffer layer;
   an underlayer formed on the bump layer: and
   a magnetic layer on the underlayer, wherein the substrate comprises an electrically conductive graphite or an aluminum-based alloy.

2. The magnetic recording medium according to claim 1, wherein the magnetic recording medium comprises an aluminum-based alloy.

* * * * *